United States Patent
Ye et al.

(10) Patent No.: US 7,123,500 B2
(45) Date of Patent: Oct. 17, 2006

(54) 1P1N 2T GAIN CELL

(75) Inventors: Yibin Ye, Portland, OR (US); Dinesh Somasekhar, Portland, OR (US); Muhammad M. Khellah, Lake Oswego, OR (US); Fabrice Paillet, Hillsboro, OR (US); Stephen H. Tang, Pleasanton, CA (US); Ali Keshavarzi, Portland, OR (US); Shih-Lien L. Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/749,734

(22) Filed: Dec. 30, 2003

(65) Prior Publication Data

US 2005/0146921 A1    Jul. 7, 2005

(51) Int. Cl.
*G11C 11/24* (2006.01)
(52) U.S. Cl. ...................... 365/139; 365/102
(58) Field of Classification Search ................ 365/149, 365/104, 203
See application file for complete search history.

(56) References Cited

U.S. PATENT DOCUMENTS

| | | | | |
|---|---|---|---|---|
| 4,864,374 A | * | 9/1989 | Banerjee | 365/174 |
| 4,920,391 A | * | 4/1990 | Uchida | 365/149 |
| 5,010,519 A | * | 4/1991 | Yoshimoto et al. | 365/149 |
| 5,122,986 A | * | 6/1992 | Lim | 365/189.11 |
| 5,388,068 A | * | 2/1995 | Ghoshal et al. | 365/162 |
| 5,675,160 A | * | 10/1997 | Oikawa | 257/296 |
| 5,732,014 A | * | 3/1998 | Forbes | 365/149 |
| 5,757,693 A | * | 5/1998 | Houghton et al. | 365/149 |
| 5,838,203 A | | 11/1998 | Stamoulis et al. | |
| 5,883,829 A | * | 3/1999 | van der Wagt | 365/159 |
| 5,923,593 A | * | 7/1999 | Hsu et al. | 365/189.04 |
| 5,943,270 A | * | 8/1999 | Borkar | 365/189.01 |
| 5,953,249 A | * | 9/1999 | van der Wagt | 365/175 |
| 5,986,473 A | | 11/1999 | Krishnamurthy et al. | |
| 6,002,272 A | | 12/1999 | Somasekhar et al. | |
| 6,014,041 A | | 1/2000 | Somasekhar et al. | |
| 6,100,751 A | | 8/2000 | De et al. | |
| 6,154,045 A | | 11/2000 | Ye et al. | |
| 6,169,419 B1 | | 1/2001 | De et al. | |
| 6,181,608 B1 | | 1/2001 | Keshavarzi et al. | |
| 6,191,606 B1 | | 2/2001 | Ye et al. | |
| 6,216,239 B1 | * | 4/2001 | Lien | 714/718 |
| 6,218,892 B1 | | 4/2001 | Soumyanath et al. | |
| 6,218,895 B1 | | 4/2001 | De et al. | |
| 6,232,827 B1 | | 5/2001 | De et al. | |
| 6,246,083 B1 | * | 6/2001 | Noble | 257/296 |
| 6,272,666 B1 | | 8/2001 | Borkar et al. | |
| 6,275,071 B1 | | 8/2001 | Ye et al. | |
| 6,300,819 B1 | | 10/2001 | De et al. | |
| 6,314,017 B1 | * | 11/2001 | Emori et al. | 365/149 |
| 6,316,960 B1 | | 11/2001 | Ye | |
| 6,329,874 B1 | | 12/2001 | Ye et al. | |

(Continued)

OTHER PUBLICATIONS

Ikeda, N., et al., "A Novel Logic Compatible Gain Cell with two Transistors and one Capacitor," ULSI R&D Laboratories, LSI Business & Technology Group.

(Continued)

*Primary Examiner*—Thong Q. Le
(74) *Attorney, Agent, or Firm*—Schwabe, Williamson & Wyatt, P.C.

(57) ABSTRACT

A two-transistor DRAM cell includes an NMOS device and a PMOS device coupled to the NMOS device.

10 Claims, 4 Drawing Sheets

U.S. PATENT DOCUMENTS

| | | | |
|---|---|---|---|
| 6,351,156 B1 | 2/2002 | Hamzaoglu et al. | |
| 6,400,206 B1 | 6/2002 | Kim et al. | |
| 6,411,156 B1 | 6/2002 | Borkar | |
| 6,421,269 B1 | 7/2002 | Somasekhar et al. | |
| 6,421,289 B1 | 7/2002 | Lu et al. | |
| 6,459,316 B1 | 10/2002 | Vangal et al. | |
| 6,486,706 B1 | 11/2002 | Ye et al. | |
| 6,492,837 B1 | 12/2002 | Narendra et al. | |
| 6,496,040 B1 | 12/2002 | Narendra et al. | |
| 6,496,402 B1 | 12/2002 | Somasekhar et al. | |
| 6,509,772 B1 | 1/2003 | Ye et al. | |
| 6,515,513 B1 | 2/2003 | Ye et al. | |
| 6,519,176 B1 | 2/2003 | Hamzaoglu et al. | |
| 6,529,045 B1 | 3/2003 | Ye et al. | |
| 6,545,619 B1 | 4/2003 | Segura et al. | |
| 6,567,329 B1 | 5/2003 | Somasekhar et al. | |
| 6,593,799 B1 | 7/2003 | De et al. | |
| 6,597,223 B1 | 7/2003 | Vangal et al. | |
| 6,597,594 B1 * | 7/2003 | Waller | 365/49 |
| 6,608,786 B1 | 8/2003 | Somasekhar et al. | |
| 6,653,866 B1 | 11/2003 | Narendra et al. | |
| 6,701,339 B1 | 3/2004 | Vangal et al. | |
| 6,707,708 B1 | 3/2004 | Alvandpour et al. | |
| 6,707,755 B1 | 3/2004 | Somasekhar et al. | |
| 6,721,222 B1 | 4/2004 | Somasekhar et al. | |
| 6,724,648 B1 | 4/2004 | Khellah et al. | |
| 6,724,649 B1 | 4/2004 | Ye et al. | |
| 6,734,498 B1 | 5/2004 | Keshavarzi et al. | |
| 6,737,924 B1 | 5/2004 | Paillet et al. | |
| 6,744,301 B1 | 6/2004 | Tschanz et al. | |
| 6,757,784 B1 | 6/2004 | Lu et al. | |
| 6,765,414 B1 | 7/2004 | Keshavarzi et al. | |
| 6,784,688 B1 | 8/2004 | Khellah et al. | |
| 6,784,722 B1 | 8/2004 | Tang et al. | |
| 6,787,835 B1 * | 9/2004 | Atwood et al. | 257/296 |
| 6,801,463 B1 | 10/2004 | Khellah et al. | |
| 6,801,465 B1 | 10/2004 | Somasekhar et al. | |
| 2001/0011917 A1 | 8/2001 | Kim et al. | |
| 2002/0067189 A1 | 6/2002 | Ye et al. | |
| 2002/0070781 A1 | 6/2002 | Vangal et al. | |
| 2002/0175726 A1 | 11/2002 | Vangal et al. | |
| 2002/0184285 A1 | 12/2002 | Pangal et al. | |
| 2002/0194240 A1 | 12/2002 | Pangal et al. | |
| 2003/0030466 A1 | 2/2003 | Narendra et al. | |

OTHER PUBLICATIONS

C.N.C., Sony Corporation, Japan, 2000 Symposium on VSLI Technology Digest of Technical Papers, IEEE, pp. 168-169.

* cited by examiner

1P1N 2T GAIN CELL

BACKGROUND

The use of embedded memories has become increasingly common in the design of integrated circuits such as microprocessors. A 2T (e.g., two-transistor) gain cell is one type of embedded memory which is commonly used in dynamic random access memory (DRAM). In a 2T cell there is typically one transistor to control read operations and one transistor to control write operations.

The amount of gate leakage current in a memory cell, such as a 2T gain cell, can determine how often a memory cell will need to be refreshed, and is often used as a measure of memory cell quality. When a memory cell is in the middle of a refresh cycle for example, devices such as a microprocessor that wish to access the memory cell are required to wait until the refresh process is complete, thereby impacting system performance.

In the past, the amount of leakage current existing in memory cells was negligible due to relatively thick oxide layers within the transistors of the memory cells. However, as oxide layers continue to become thinner and thinner due to technology scaling for example, the measure of leakage current within memory cell devices has become an increasingly important design limitation.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF ILLUSTRATED EMBODIMENTS

In the following detailed description, numerous specific details are set forth in order to provide a thorough understanding of embodiments of the present invention. However, those skilled in the art will understand that such embodiments may be practiced without these specific details. In other instances, well known methods, procedures, components, and circuits have not been described in detail.

Although various discrete operations will be described herein, the mere order of description should not be construed as to imply that these operations are necessarily performed in the order they are presented.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments. Lastly, the terms "comprising", "including", "having", and the like, as used in the present application, are intended to be synonymous.

Figure 1:
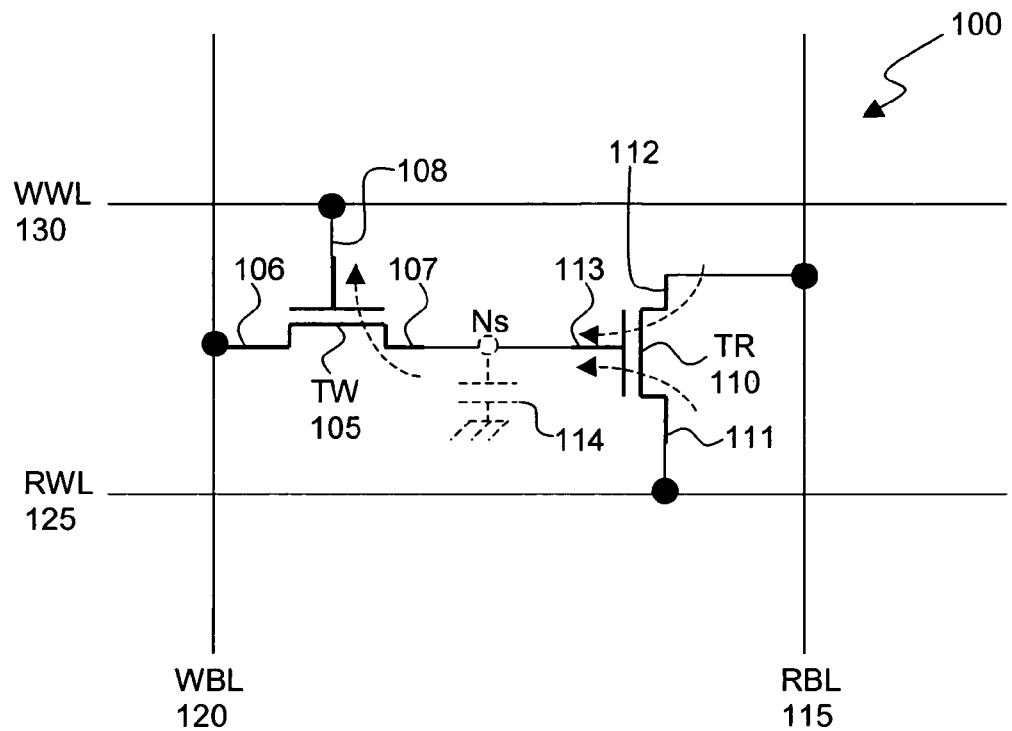
FIG. 1 illustrates a schematic diagram of a conventional two-transistor gain cell utilizing two n-channel metal oxide semiconductor (NMOS) devices.

FIG. 1 illustrates a schematic diagram of a conventional 2T gain cell utilizing two n-channel metal oxide semiconductor (NMOS) devices. As shown, memory cell 100 includes a first NMOS device TW 105 having a first controlled node 106, a second controlled node 107, and a gate 108. Since MOS transistors are symmetrical, the designation of a source or drain terminal is somewhat arbitrary as determined by the voltage applied to the device. Accordingly, the term "controlled node", as used herein, may refer to either a source or drain terminal within a MOS transistor (e.g., NMOS and PMOS). Memory cell 100 further includes a second NMOS device TR 110 having a first controlled node 111, a second controlled node 112, and a gate 113. As shown, the gate 113 of TR 110 may be coupled to the second controlled node 107 of TW 105 defining a charge storage node (Ns) 114 therebetween. The charge storage node Ns 114 may have a capacitance equal to the sum of the parasitic capacitance of the second controlled node 107 of TW 105 and the parasitic capacitance of the gate 113 of TR 110.

In FIG. 1, TR 105 is configured as a write device and is coupled to a write word-line (WWL) 130 and a write bit-line (WBL) 120. In contrast, TR 110 is configured as a read device and is coupled to a read word-line (RWL) 125 and a read bit-line (RBL) 115. In memory cell 100, a write operation may be performed when WWL 130 is transitioned to a logic high state causing write device TW 105 to turn-on. In order for a "0" to be written into the memory cell, WBL 120 may be set to a logic low state causing the cell storage node Ns 114 to be pulled to ground. In order for a "1" to be written into memory cell 100, WBL 120 may be set to a logic high state causing Ns 114 to maintain a voltage ($V_{HIGH}-V_t$), where $V_{HIGH}$ is the voltage of WBL ($V_{WBL}$) and $V_t$ is the threshold voltage of write device TW 105. At the end of a write operation, WWL 130 may be transitioned to a logic low state causing write device TW 105 to be effectively turned OFF. Throughout the write operation, both RWL 125 and RBL 115 may be held at $V_{HIGH}$ causing read device TR 110 to be similarly turned off.

In memory cell 100, a read operation may start with RWL 125 being pulled to a lower voltage from $V_{HIGH}$, causing read device TR 110 to be turned on. The read current strongly depends on the gate-to-source voltage ($V_{NS}-V_{RWL}$) of the read device TR 110. For example, a larger current may be drawn by read device TR 110 from RBL 115 to RWL 125 when a "1" is stored in the memory cell 100 since $V_{NS}$ will be higher than if a "0" is stored. Accordingly, the voltage at RBL 115 may fall faster when a "1" is stored in the cell than when a "0" is stored. A sense amplifier (not shown) coupled to RBL 115 is able to detect whether a "1" or a "0" is stored in the memory cell (e.g. as determined by $V_{NS}$) using well-known sensing methods, such as by comparing RBL 115 to a reference bit-line.

When memory cell 100 is not selected to perform read or write operation, it is considered to be in a hold state. In memory cell 100, such a hold state occurs when WWL 130 is low, RWL 125 and RBL 115 are high, and WBL 120 is either low or high. In such a hold state, both read device TR 110 and write device TW 105 are turned off and the voltage stored at Ns 114 may be retained for an amount of time equal to the retention time, which is limited by the amount of leakage current in the device.

As technology scales, and thickness of the oxide layer(s) used in such read and write devices becomes smaller, the more significant of a role the gate leakage of such devices plays. In particular, as the oxide layer thickness in a MOS device decreases, the leakage current between the gate and the two edges (e.g. controlled nodes) of the MOS device, as well as the leakage current between the gate and the substrate of the device can become significant.

In memory cell 100 of FIG. 1 for example, the main gate leakage components are two edge leakage currents (at controlled nodes 111 and 112) in read device TR 110, and one edge leakage current (at controlled node 106) in write device TW 105. More specifically, since WWL 130 is at a logic low state and RWL 125 and RBL 115 are each at a logic high state, the voltage at Ns 114 ($V_{NS}$) gradually tends to settle to an intermediate voltage ($V_{FINAL}$) due to gate leakage. Unfortunately, however, in conventional two-transistor memory cells such as memory cell 100, $V_{FINAL}$ is often approximately Vcc/2 resulting in relatively small retention times.

Figure 2:
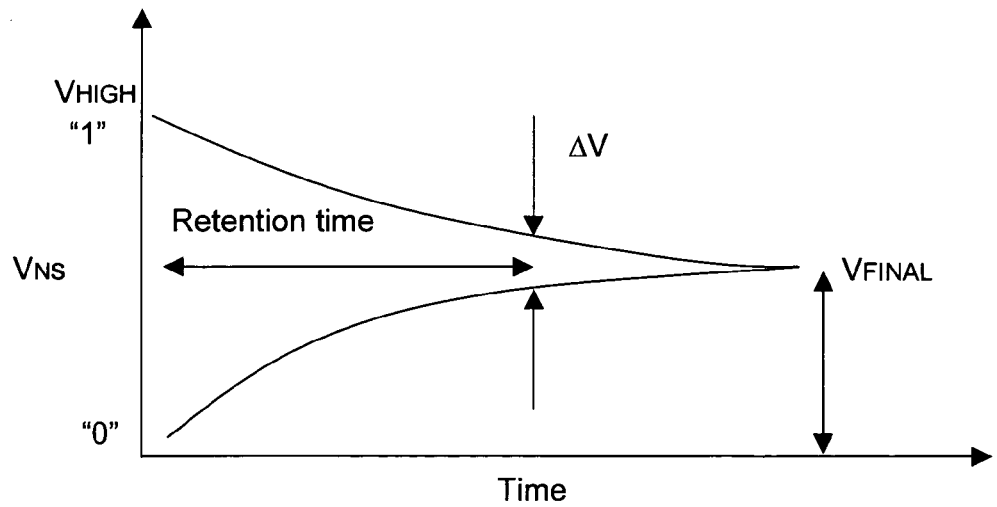
FIG. 2 illustrates an example graph of the voltage level at storage node Ns 114 of memory cell 100 as a function of time.

FIG. 2 illustrates an example graph of the voltage level at storage node Ns 114 of conventional memory cell 100 as a function of time. As shown in FIG. 2, after a "0" is written into a memory cell, such as memory cell 100, $V_{NS}$ is pulled up by the gate leakage at TR 110 eventually stopping at $V_{FINAL}$ where the leakage components are balanced. When a "1" is written into memory cell 100, $V_{NS}$ is pulled down by the leakage component at TW 105 likewise causing $V_{NS}$ to converge to $V_{FINAL}$. Thus, unless conventional memory cells, such as memory cell 100, are recharged in an amount of time that is less than the retention time ($T_{RET}$), the datum stored within such memory cells will typically collapse. The retention time $T_{RET}$ refers to the time when the voltage difference of "1" and "0" collapses to certain 'delta V', that can be still sensed correctly. Retention time is an important performance measure of DRAM memory circuits as it determines how often cells need to be refreshed. Unfortunately, conventional 2T gain cells (such as memory cell 100 of FIG. 1 in which two NMOS transistors are used) will continue to exhibit shorter and shorter retention times as technology continues to scale down.

Figure 3:
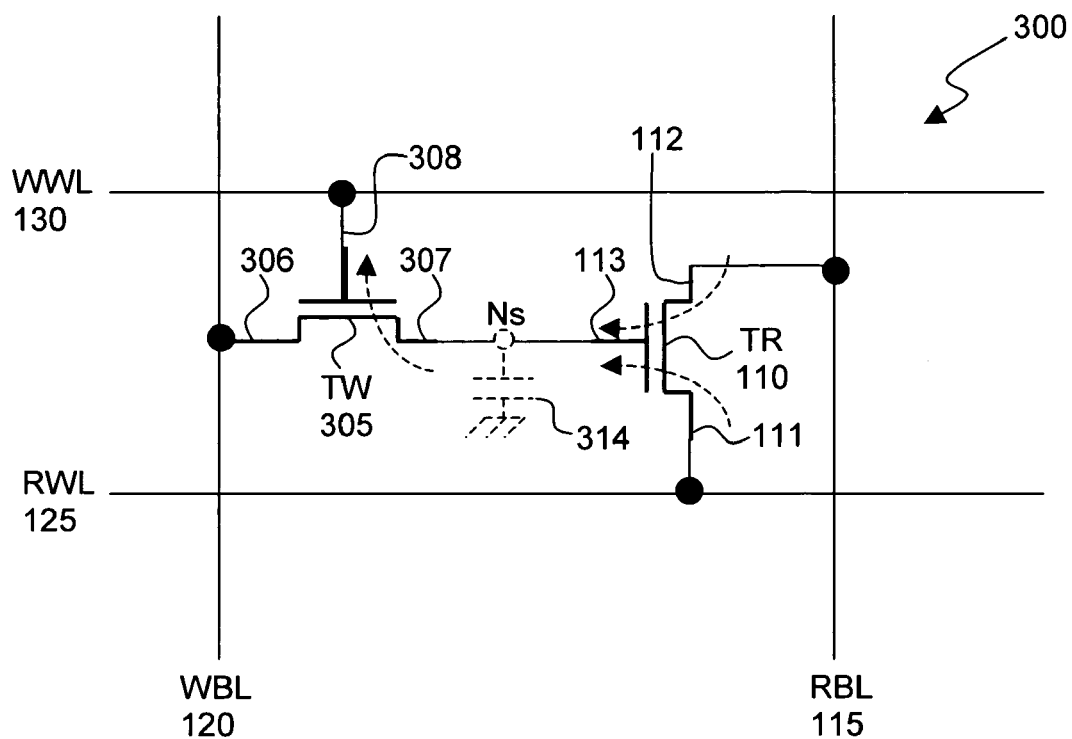
FIG. 3 illustrates a schematic diagram of a novel two-transistor gain cell arrangement utilizing one NMOS device and one PMOS device, in accordance with one embodiment of the present invention.

FIG. 3 illustrates a schematic diagram of a 2T gain cell utilizing one NMOS device and one PMOS device in accordance with one embodiment of the present invention. In contrast to memory cell 100 of FIG. 1, memory cell 300 of FIG. 3 includes PMOS device TW 305 in place of NMOS device TW 105 to facilitate decreased gate leakage current and increased retention time within memory cell 300. As with memory cell 100, memory cell 300 includes WWL 130, RWL 125, WBL 120, and RBL 115. In one embodiment, PMOS device TW 305 may be coupled to WWL 130, WBL 120, and NMOS device TR 110 as shown. More specifically, controlled node 306 of PMOS device TW 305 may be coupled to WBL 120, and gate 308 may be coupled to WWL 130. Furthermore, controlled node 307 may be coupled to gate 113 of NMOS device TR 110 forming charge storage node Ns 314 there between.

The operation of memory cell 300 is similar to that of the conventional 2T memory cell 100 of FIG. 1, except that WWL 130 is transitioned to a logic low state in order to turn on write device TW 305 in a write operation and is otherwise held at $V_{HIGH}$. For example, In order for a "0" to be written into the memory cell, WBL 120 is set to a logic low state and the cell storage node Ns 314 is pulled to. Vt, where Vt is the threshold voltage of write device TW 305. In order for a "1" to be written into memory cell 300, WBL 120 is set to a logic high state causing Ns 314 to maintain a voltage VHIGH, where $V_{HIGH}$ is the voltage of WBL ($V_{WBL}$). At the end of a write operation, WWL 130 is transitioned to a logic high state causing write device TW 305 to be effectively turned OFF. Throughout the write operation, read device TR 110 is similarly turned OFF as both RWL 125 and RBL 115 are set at $V_{HIGH}$. As a result, the storage node Ns 314 of memory cell 300 converges to $V_{FINAL}$ after a write operation, where $V_{FINAL}=V_{HIGH}$, since WWL 130, RWL 125 and RBL 115 are held at $V_{HIGH}$.

Figure 4:
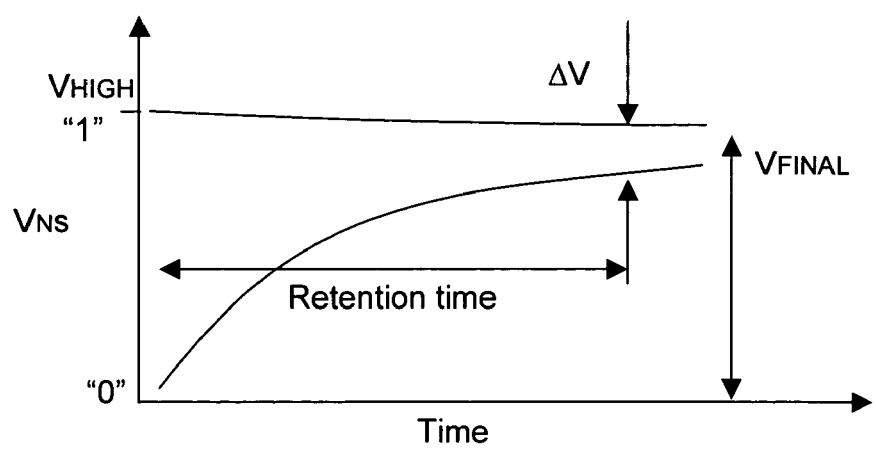
FIG. 4 illustrates an example graph of the voltage level at the storage node Ns 314 of memory cell 300 as a function of time.

FIG. 4 illustrates an example graph of the voltage level as a function of time at the storage node Ns 314 of memory cell 300 of FIG. 3. After a "0" is written into memory cell 300, $V_{NS}$ is pulled up by the gate leakage at TR 110 and eventually stops at $V_{FINAL}$ where the leakage components are zero. Similarly, when a "1," is written into memory cell 300, $V_{NS}$ remains at VHIGH. Since Vfinal approaches Vhigh, the gate leakage decays rapidly and the time it takes $V_{NS}$ to converge to Vfinal is longer than the scenario described with respect to FIG. 1. Accordingly, by replacing one NMOS device of a two-transistor memory cell with a PMOS device, it is possible to increase retention time of the memory cell, thereby decreasing the number of time the memory cell needs to be refreshed.

Furthermore, the behavior of the edge leakage current for the MOS devices of memory cell 300 is also different. When VNs starts from $V_{LOW}$ and collapses to $V_{HIGH}$, the voltage level difference between VNs and $V_{HIGH}$ also decreases. Thus, all three leakage current components act to decrease themselves as the collapse continues, which in turn slows down the collapsing process. The closer VNs gets to $V_{HIGH}$, the smaller the leakage current becomes (for all three edge leakage components), and hence the slower VNs increases. Thus, the retention time for a memory cell, containing one NMOS device and one PMOS device, such as memory cell 300, can be extended beyond that of conventional 2T memory cells, as e.g., illustrated in FIG. 1.

Figure 5:
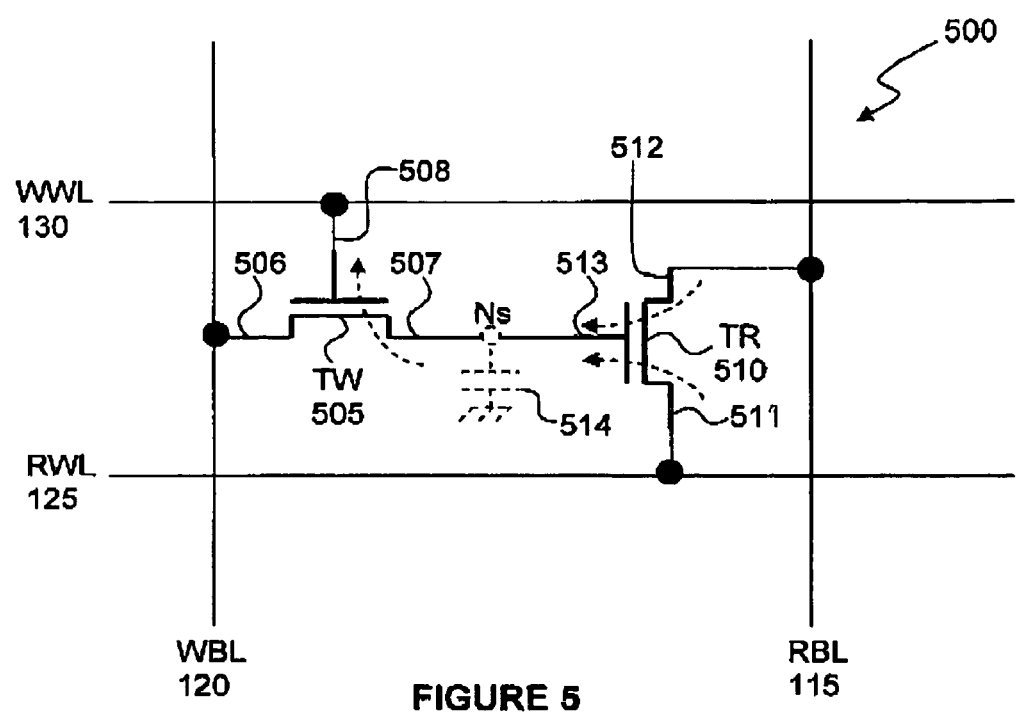
FIG. 5 illustrates a schematic diagram of a two-transistor gain cell utilizing one NMOS device and one PMOS device in accordance with an alternative embodiment of the present invention.

FIG. 5 illustrates a schematic diagram of a 2T gain cell utilizing one NMOS device and one PMOS device in accordance with an alternative embodiment of the present invention. In memory cell 500 of FIG. 5, the PMOS device 510 is configured as a read device while the NMOS device 505 is configured as a write device. In particular, NMOS device TW 505 may be coupled to WWL 130, WBL 120, and PMOS device TR 510, while PMOS device TR 510 may be coupled to RWL 125, RBL 115, and NMOS device TW 505 as shown.

In memory cell 500, WWL 130, RWL 125, and RBL 115 may be held at a logic low state in order for a datum to be stored within charge storage node Ns 514. In order to perform a write operation, WWL 130 may be transitioned to a logic high state causing write device TW 505 to turn-on. In order for a "0" to be written into the memory cell, WBL 120 may be set to a logic low state causing the cell storage node Ns 514 to be pulled to ground. In order for a "1" to be written into memory cell 500, WBL 120 may be set to a logic high state causing Ns 514 to maintain a voltage ($V_{HIGH}-Vt$), where $V_{HIGH}$ is the voltage of WBL ($V_{WBL}$) and Vt is the threshold voltage of write device TW 505. At the end of a write operation, WWL 130 may be transitioned back to a logic low state causing write device TW 505 to be effectively turned OFF. Throughout the write operation, read device TR 510 is similarly turned OFF as both RWL 125 and RBL 115 are set at logic low state.

Figure 6:
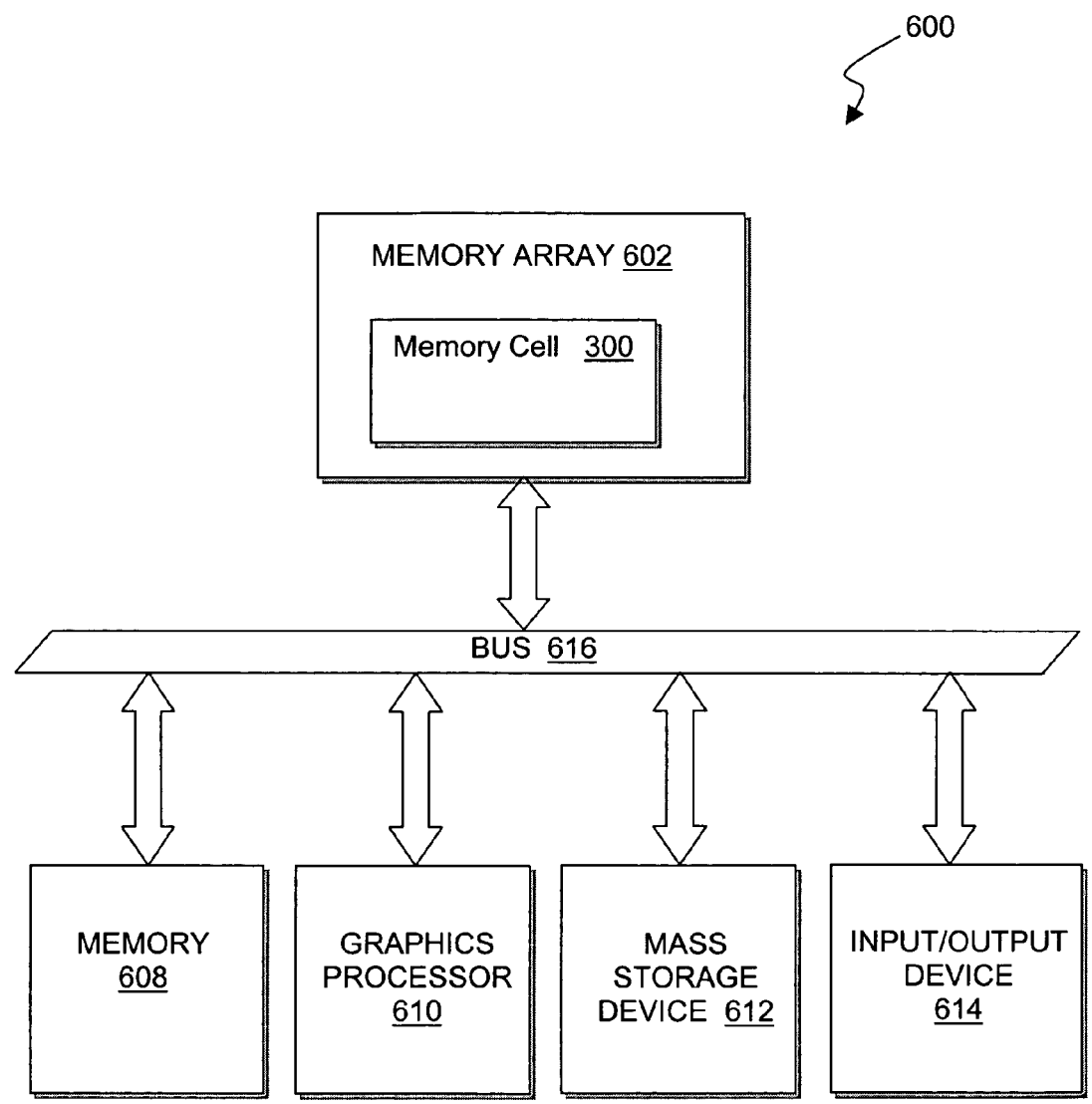
FIG. 6 illustrates one of many possible systems in which a two-transistor DRAM memory cell may be used.

FIG. 6 illustrates one of many possible systems in which a two-transistor DRAM memory cell (such as memory cell 300 or 500) equipped with an NMOS device and a PMOS device in accordance with one embodiment of the invention may be used. In one embodiment, memory cell 300 may form part of a memory array such as a cache memory implemented in an integrated circuit (IC) 602 of system 600. In one embodiment, IC 602 may be a microprocessor. In alternate embodiments, IC 602 may be an application specific IC (ASIC).

In the illustrated embodiment, system 600 also includes a main memory 608, a graphics processor 610, a mass storage device 612 and an input/output module 614 coupled to each other by way of a communication channel 616. However, system 600 may include additional or fewer components than those illustrated without departing from the spirit and scope of the invention. Examples of the memory 608 include but are not limited static random access memory (SRAM) and dynamic random access memory (DRAM). Examples of the mass storage device 612 include but are not limited to a hard disk drive, a compact disk drive (CD), a digital versatile disk driver (DVD), and so forth. Examples of the input/output modules 614 include but are not limited to a keyboard, cursor control devices, a display, a network interface, and so forth. Examples of the communication channel 616 include but are not limited to a wired and/or wireless communication channel such as a peripheral control interface (PCI) bus, an Industry Standard Architecture (ISA) bus, and so forth. In various embodiments, the system 600 may be a wireless mobile phone, a personal digital assistant, a pocket PC, a tablet PC, a notebook PC, a desktop computer, a set-top box, an entertainment unit, a DVD player, and a server.

While the present invention has been described in terms of the above-illustrated embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

What is claimed is:

1. A two-transistor DRAM cell consisting:
   an NMOS device with a first gate adapted to couple with write word line, a first controlled node adapted to couple with write bit line, and a second controlled node;
   a PMOS device with a second gate, a third controlled node adapted to couple with a read word line, and a fourth controlled node adapted to couple with read bit line, the second gate of the PMOS device coupled to the second controlled node of the NMOS device; and
   a storage node coupled to the second gate of the PMOS device and the second controlled node of the NMOS device, wherein the NMOS and PMOS devices are adapted to provide to the storage node a capacitance equal to a sum of parasitic capacitances of the second controlled node of the NMOS device and the second gate of the PMOS device.

2. The two-transistor DRAM cell of claim 1, wherein the storage node having a voltage that converges to Vhigh, where Vhigh is greater than Vcc/2.

3. A two-transistor DRAM cell consisting:
   a read bit line;
   a write bit line;
   a read word line;
   a write word line;
   an NMOS device with a first gate region coupled to the write word line, a first controlled node region coupled to the write bit line, and a second controlled node region;
   a PMOS device with a second gate region, a third controlled node region coupled to the read word line, and a fourth controlled node region coupled to the read bit line, the second gate region of the PMOS device coupled to the second controlled node region of the NMOS device; and
   a storage node coupled to the second gate region of the PMOS device and the second control node region of the NMOS device, wherein the NMOS and PMOS devices are adapted to provide to the storage node a capacitance equal to a sum of parasitic capacitances of the second controlled node of the NMOS device and the second gate of the PMOS device.

4. The DRAM cell of claim 3, wherein the write word line is pulled from a logic low voltage to a logic high voltage to write data into the DRAM cell.

5. The DRAM cell of claim 3, wherein the read word line, the read bit line and the write word line are held at a logic low voltage to hold data within the DRAM cell.

6. The DRAM cell of claim 3, wherein the data written into the DRAM cell corresponds to the voltage level of the write bit line.

7. The DRAM cell of claim 3, wherein a voltage level of the storage node converges to logic high due to edge leakage current.

8. A system comprising:
   an integrated circuit (IC); and
   memory coupled to the IC, the memory including at least one two-transistor DRAM cell consisting
   an NMOS device with a first gate coupled to a write word line, a first controlled node coupled to a write bit line, and a second controlled node;
   a PMOS device with a second gate, a third controlled node coupled to a read word line, and a fourth controlled node coupled to a read bit line, the second gate of the PMOS device coupled to the second controlled node of the NMOS device; and
   a storage node coupled to the second gate of the PMOS device and the second controlled node of the NMOS device, wherein the NMOS and PMOS devices are adapted to provide to the storage node a capacitance equal to a sum of parasitic capacitances of the second controlled node of the NMOS device and the second gate of the PMOS device.

9. The system according to claim 8, wherein the IC comprises a central processing unit, and at least one input/output module coupled to the central processor unit.

10. The system of claim 8, wherein the memory is coupled to the IC via the communication channel.

* * * * *

UNITED STATES PATENT AND TRADEMARK OFFICE
CERTIFICATE OF CORRECTION

PATENT NO. : 7,123,500 B2  Page 1 of 1
APPLICATION NO. : 10/749734
DATED : October 17, 2006
INVENTOR(S) : Yibin Ye It is certified that error appears in the above-identified patent and that said Letters Patent is hereby corrected as shown below:

In the drawings,

Figure 5

Delete reference Nos. 506, 507, 508, 511, 512.

Column 2

Line 33, "..., TR 105..." should read --..., TW 105...--.

Column 3

Line 53, "...of-FIG. 3..." should read --...of FIG. 3...--.

Signed and Sealed this

Twelfth Day of August, 2008

JON W. DUDAS
*Director of the United States Patent and Trademark Office*